United States Patent
Song et al.

(10) Patent No.: US 8,415,874 B2
(45) Date of Patent: Apr. 9, 2013

(54) ORGANIC LIGHT-EMITTING DEVICE AND METHOD OF MANUFACTURING THE SAME

(75) Inventors: Hyung-Jun Song, Yongin (KR); Kyu-Hwan Hwang, Yongin (KR); Chang-Ho Lee, Yongin (KR); Hee-Joo Ko, Yongin (KR); Seok-Gyu Yoon, Yongin (KR); Il-Soo Oh, Yongin (KR); Se-Jin Cho, Yongin (KR); Jin-Young Yun, Yongin (KR); Jong-Hyuk Lee, Yongin (KR); Yong-Tak Kim, Yongin (KR); Won-Jung Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/043,371

(22) Filed: Mar. 8, 2011

(65) Prior Publication Data

US 2011/0309739 A1     Dec. 22, 2011

(30) Foreign Application Priority Data

Jun. 16, 2010   (KR) ........................ 10-2010-0057112

(51) Int. Cl.
*H05B 33/00*   (2006.01)

(52) U.S. Cl.
USPC .............................. 313/504; 313/506; 428/917

(58) Field of Classification Search ........................ None
See application file for complete search history.

(56) References Cited

U.S. PATENT DOCUMENTS

| | | | |
|---|---|---|---|
| 6,280,860 B1 | 8/2001 | Ueda et al. | |
| 6,281,627 B1 | 8/2001 | Arai et al. | |
| 6,734,622 B1 | 5/2004 | Kanitz et al. | |
| 2005/0168137 A1* | 8/2005 | Adamovich et al. | 313/504 |
| 2006/0121313 A1 | 6/2006 | Lee et al. | |
| 2006/0125376 A1 | 6/2006 | Ghosh et al. | |
| 2006/0154107 A1* | 7/2006 | Kubota et al. | 428/690 |

FOREIGN PATENT DOCUMENTS

| | | | |
|---|---|---|---|
| JP | 2008-116825 A | | 5/2008 |
| JP | 2009-054710 | | 3/2009 |
| KR | 10-0766947 | | 10/2007 |
| KR | 10-2008-0061732 A | | 7/2008 |
| KR | 10-2008-0102576 | * | 11/2008 |
| KR | 10-2008-0102576 A | | 11/2008 |
| KR | 10-2009-0047158 A | | 5/2009 |

* cited by examiner

*Primary Examiner* — Ashok Patel
(74) *Attorney, Agent, or Firm* — Knobbe Martens Olson & Bear LLP

(57) ABSTRACT

An organic light-emitting device including: a substrate; a first electrode disposed on the substrate; a second electrode disposed on the substrate and comprising silver (Ag); an emission layer between the first electrode and the second electrode; an electron injection layer between the emission layer and the second electrode and comprising a mixture of an alkali metal-containing compound and a first metal; and a capping layer disposed on the second electrode.

20 Claims, 4 Drawing Sheets

ORGANIC LIGHT-EMITTING DEVICE AND METHOD OF MANUFACTURING THE SAME

CROSS-REFERENCE TO RELATED APPLICATIONS

This application claims the benefit of Korean Patent Application No. 10-2010-0057112, filed on Jun. 16, 2010, in the Korean Intellectual Property Office, the disclosure of which is incorporated herein in its entirety by reference.

BACKGROUND

1. Field

The present embodiments relate to an organic light-emitting device and a method of manufacturing the same.

2. Description of the Related Technology

In an organic light-emitting device including an anode, a cathode, and an organic layer between the anode and cathode, a mixture of magnesium (Mg) and silver (Ag) is currently being widely used to manufacture the cathode, particularly, of a top-emission light-emitting device.

Magnesium, having a low-work function and which is good to form a thin film on an electron injection layer (EIL), is advantageous in terms of electron injection and device stability. Ag has good reflection characteristics, and may form micro-cavities along with a reflective anode when used to form the cathode, thereby improving efficiency of a device.

However, a cathode made of Mg and Ag has a very high resistance, and thus is not suitable to implement uniform-quality images on a front panel, and additional compensation circuits are required in this regard.

Even when a capping layer (CPL) consisting of an organic material or an oxide having a high refractive index is further deposited on the cathode made of Mg and Ag, light generated in the organic light-emitting device may have low transmittance. Furthermore, the Mg—Ag cathode with such a thin film absorbs a larger amount of light than thin-film type cathodes consisting of other metals, and thus may reduce the efficiency of the organic light-emitting device.

To address these drawbacks, thin-film cathodes in various composition ratios of Mg and Ag have been suggested. The higher the percentage of Ag, the lower the light absorption by the thin-film type cathode, the higher the light reflection, and the better the resistance characteristics. However, the higher percentage of Ag may hinder the injection of electrons and lead to a higher driving voltage and a lower efficiency of the organic light-emitting device. Also, the higher the percentage of Mg, the higher the light absorption due to Mg, the lower the efficiency of the organic light-emitting device, and the higher the resistance.

In order to improve the resistance and transmittance characteristics of conventional Mg—Ag thin-film type cathodes, a top-emission organic light-emitting device including a thin film cathode consisting of only Ag has been suggested. In this regard, a capping region of the top-emission organic light-emitting device defined for improving external emission efficiency consists of oxide alone, and materials for an electron injection layer are limited to LIF/Al, Mg, Ag, ytterbium (Yb), rubidium (Rb), cesium (Cs), barium (Ba), calcium (Ca)-aluminum (Al), Mg—Al, Li/Al, Li$_2$O/Al, and mixtures thereof. However, considering the nature of oxide, high-temperature deposition or sputtering is necessary for such organic light-emitting devices, which may damage the thin film Ag cathode and may limit materials available for the electron injection layer.

Therefore, there is a demand for an organic light-emitting device structure providing good optical characteristics at a reasonable resistance and which facilitates injection of electrons.

SUMMARY

The present embodiments provide an organic light-emitting device in which resistance and optical characteristics are improved to enhance the efficiency of the organic light-emitting device.

The present embodiments provide a method of manufacturing the organic light-emitting device.

According to an aspect of the present embodiments, there is provided an organic light-emitting device including: a substrate; a first electrode disposed on the substrate; a second electrode disposed on the substrate and comprising silver (Ag); an emission layer between the first electrode and the second electrode; an electron injection layer between the emission layer and the second electrode and comprising a mixture of an alkali metal-containing compound and a first metal; and a capping layer disposed on the second electrode.

The alkali metal-containing compound may include at least one material selected from the group consisting of LiF, LiQ, CsF, NaF, NaQ, and Li$_2$O.

The first metal may include at least one metal selected from the group consisting of ytterbium (Yb), terbium (Tb), holmium (Ho), samarium (Sm), europium (Eu), praseodymium (Pr), cerium (Ce), aluminum (Al), and magnesium (Mg).

A weight ratio of the alkali metal-containing compound and the first metal may be from about 1:9 to about 9:1.

The alkali metal-containing compound may include LiQ, the first metal may include Yb, and a weight ratio of LiQ to Yb may be about 1:1.

The electron injection layer may have a thickness of about 0.1 to about 30 nm.

The second electrode may further include at least one second metal selected from the group consisting of aluminum (Al), platinum (Pt), ytterbium (Yb), neodymium (Nd), and magnesium (Mg), and the amount of the second metal is from about 0.01 to about 20 parts by weight based on 100 parts by weight of Ag.

The second electrode may have a thickness of about 1 nm to about 30 nm.

The capping layer may include an organic material, an inorganic material, or a mixture thereof.

The capping layer may have a refractive index of about 1.2 to about 5.0.

The capping layer may include an inorganic material, and the inorganic material comprises at least one selected from the group consisting of ITO, IZO, SiO$_2$, SiNx, Y$_2$O$_3$, WO$_3$, MoO$_3$, and Al$_2$O$_3$.

The capping layer may include an organic material, and the organic material comprises at least one selected from the group consisting of triamine derivatives, arylene diamine derivatives, tris(8-quinolinorato)aluminum (Alq3), and 4,4'-biscarbazolylbiphenyl (CBP).

The capping layer may have a thickness of about 1 nm to about 200 nm.

The organic light-emitting device may further include a hole injection layer, a hole transport layer, or a hole injection and transport layer between the first electrode and the emission layer.

According to another aspect of the present embodiments, there is provided a bottom-emission organic light-emitting device including: a substrate; a first electrode disposed on the substrate; a second electrode disposed on the substrate and comprising silver (Ag); an emission layer between the first electrode and the second electrode; an electron injection layer between the emission layer and the second electrode and comprising a mixture of an alkali metal-containing compound and a first metal; and a capping layer disposed on a surface of the second electrode opposite to the emission layer.

According to another aspect of the present embodiments, there is provided a method of manufacturing an organic light-emitting device, the method including: preparing a substrate; forming a first electrode on the substrate; forming a hole injection and transport layer on the first electrode; forming an emission layer on the hole injection and transport layer; forming an electron injection layer comprising a mixture of an alkali metal-containing compound and a first metal on the emission layer; forming a second electrode including silver (Ag) on the electron injection layer; and forming a capping layer on the second electrode.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Figure 1:
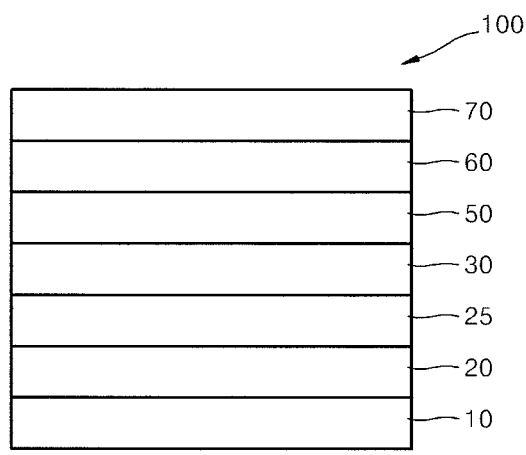
FIG. 1 is a cross-sectional view illustrating a structure of an organic light-emitting device according to an embodiment.

Reference will now be made in detail to embodiments, examples of which are illustrated in the accompanying drawings, to enable those of ordinary skill in the art to implement the same. In this regard, the present embodiments may have different forms and should not be construed as being limited to the descriptions set forth herein. Accordingly, the embodiments are merely described below, by referring to the figures, to explain aspects of the present description.

In the drawings, thicknesses of layers and regions may be exaggerated for clarity. Like reference numerals denote like elements throughout. It will be understood that when an element, such as a layer, a film, a region, or a plate, is referred to as being "on" another element, it may be directly on the other element or intervening elements may be present.

According to embodiments, an organic light-emitting device includes a substrate, a first electrode disposed on the substrate, a second electrode disposed on the substrate and including silver (Ag), an emission layer between the first and second electrodes, an electron injection layer between the emission layer and the second electrode, the electron injection layer including a mixture of an alkali metal-containing compound and a first metal, and a capping layer disposed on the second electrode.

FIG. 1 is a cross-sectional view of an organic light-emitting device 100 according to an embodiment.

Referring to FIG. 1, the organic light-emitting device 100 includes a substrate 10 and a first electrode 20 disposed on the substrate 10.

The substrate 10 may be any substrate that is conventionally used in organic light-emitting devices. The substrate 10 may comprise a material with good mechanical strength, thermal stability, transparency, surface smoothness, ease of handling, and water resistance. For example, the substrate 10 may be a glass substrate, a metal thin film, or a plastic substrate. Although not illustrated in FIG. 1, a planarization layer or an insulating layer may further be disposed between the substrate 10 and the first electrode 20, if required.

The first electrode 20 may constitute an anode or a cathode. The first electrode 20 may have a pattern corresponding to red (R), green (G) and blue (B) sub-pixels. The first electrode 20 may comprise a material having good electrical conductivity. The first electrode 20 may include any material suitable for forming the first electrode 20. Non-limiting examples of a material for the first electrode 20 include Li, Mg, Al, Ag, Al—Li, Ca, Mg—In, Mg—Ag, Ca—Al, indium tin oxide (ITO), indium zinc oxide (IZO), zinc oxide (ZnO), and Al—ITO. The first electrode 20 may be a transparent electrode, a semi-transparent electrode, or a reflective electrode. The first electrode 20 may have a structure including at least two layers using at least two materials. However, the first electrode 20 may have any of a variety of structures.

The organic light-emitting device 100 includes a second electrode 60 on the substrate 10.

The second electrode 60 may include Ag having good conductivity. Ag has a low work function and high reflectivity. The second electrode 60 may be implemented in various forms, for example, as a transparent electrode or a reflective electrode.

The second electrode 60 may further include at least one second metal selected from the group consisting of Al, Pt, Yb, Nd and Mg, in an amount of about 20 parts by weight based on 100 parts by weight of Ag. The second electrode 60 may comprise a mixture of Ag and the second metal to improve the thin film characteristics, such as transparency, of the second electrode 60. When the amount of the second metal is within this range, the organic light-emitting device may have appropriate light absorption and resistance without an increase in driving voltage.

The second electrode 60 may have a thickness of about 1 to about 30 nm. When the thickness of the second electrode 60 is within this range, the organic light-emitting device may have good optical characteristics that enable easy control of transmittance and reflectivity and lead to low light absorption, and good electrical conductivity.

The first electrode 20 and the second electrode 60 may function as an anode and a cathode, respectively, but the reverse is also possible.

The organic light-emitting device 100 may include an organic layer between the first electrode 20 and the second electrode 60. The organic layer may include an emission layer (EML) 30 and an electron injection layer (EIL) 50. For example, the organic layer may include a hole injection layer (HIL), a hole transport layer (HTL), an electron blocking layer (EBL), the EML 30, a hole blocking layer (HBL), an electron transport layer (ETL), and the EIL 50. Instead of the HIL and the HTL, a hole injection and transport layer 25 capable of functioning as both of these layers may be used. At least one of the EBL, the HBL and the ETL may be omitted.

The organic light-emitting device 100 may include the EML 30 between the first electrode 20 and the second electrode 60.

The EML 30 may include any of a variety of light-emitting materials. Examples of light-emitting materials include: blue dopants, such as oxadiazole dimer dyes (Bis-DAPOXP), spiro compounds (Spiro-DPVBi, Spiro-6P), triarylamine compounds, bis(styryl)amine (DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)(BCzVB), 4,4-bis[4-(di-p-tolylamino)styryl]biphenyl (DPAVBi), 4-(di-p-tolylamino)-4'-[(di-p-tolylamino)styryl]stilben (DPAVB), 4,4'-bis[4-(diphenylamino)styryl]biphenyl (BDAVBi), and bis(3,5-difluoro-2-(2-pyridyl)phenyl-(2-carboxypyridyl)iridium III (FIrPic); green dopants, such as 3-(2-benzothiazolyl)-7-(diethylamino)coumarin (Coumarin 6) 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), and tris(2-phenylpyridine)iridium(III) (Ir(ppy)3); and red dopants, such as tetraphenylnaphthacene (Rubrene), tris(1-phenyl-isoquinoline) iridium (III) (Ir(piq)3), bis(2-benzo[b]thiophen-2-yl-pyridine)(acetylacetonate)iridium (III) (Ir(btp)$_2$(acac)), tris(dibenzoylmethane)phenanthroline europium (III) (Eu (dbm)$_3$(phen)), tris[4,4'-di-tert-butyl-(2,2')-bipyridine]ruthenium (III) complex (Ru(dtb-bpy)$_3$*2(PF$_6$)), DCM1, DCM2, europium(thenoyltrifluoroacetone)3 (Eu(TTA)3), and butyl-6-(1,1,7,7-tetramethyljulolidyl-9-enyl)-4H-pyran (CJTB). However, any light-emitting material may be used. The light-emitting materials may include light-emitting polymers. Examples of light-emitting polymers include aromatic compounds including nitrogen and polymers, such as phenylenes, phenylene vinylenes, thiophens, fluorenes and spiro-fluorenes.

In some embodiments, the EML 30 may include an emitting host and an emitting dopant. The emitting dopant may include any of the light-emitting materials listed above. The emitting host may include a fluorescent host or a phosphorescent host. Examples of the fluorescent host include tris(8-hydroxy-quinorate)aluminum (Alq3), 9,10-di(naphthyl-2-yl)anthracene (AND), 3-tert-butyl-9,10-di(naphthyl-2-yl) anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), and the like. Examples of the phosphorescent host include 1,3-bis(carbazole-9-yl)benzene (mCP), 1,3,5-tris(carbazole-9-yl)benzene (tCP), 4,4',4"-tris (carbazole-9-yl)triphenylamine (TcTa), 4,4'-bis(carbazole-9-yl)biphenyl (CBP), 4,4'-bis(9-carbazoleyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis (carbazole-9-yl)-9,9-di-tolyl-fluorene (DPFL-CBP), 9,9-bis (9-phenyl-9H-carbazole)fluorene (FL-2CBP), and the like.

The organic light-emitting device 100 may include the EIL 50 between the EML 30 and the second electrode 60.

The EIL 50 may include a mixture of an alkali metal-containing compound and a first metal. The alkali metal-containing compound may include at least one material selected from the group consisting of LiF, LiQ, CsF, NaF, NaQ, and Li$_2$O. The first metal may include at least one material selected from the group consisting of ytterbium (Yb), terbium (Tb), holmium (Ho), samarium (Sm), europium (Eu), praseodymium (Pr), cerium (Ce), aluminum (Al), and magnesium (Mg). In the mixture of an alkali metal-containing compound and a first metal, if the weight ratios of the alkali metal-containing compound and the first metal with respect to the total weight of the mixture are represented by X and Y, respectively, the following relationships may be satisfied: $10 \leq x \leq 90$, $10 \leq y \leq 90$, and $x+y=100$. When the weight ratios of the alkali metal-containing compound and the first metal are within these ranges, injection of electrons may be facilitated, and the second electrode 60 including Ag may have improved thin film characteristics, and thus, may advantageously absorb less light.

For example, the EIL 50 may include a mixture of LiQ and Yb, for example, in a weight ratio of 1:1.

The EIL 50 may have a thickness of about 0.1 to about 30 nm. When the thickness of the EIL 50 is within this range, the EIL 50 may have good electron injection characteristics without a substantial increase in driving voltage.

Although not illustrated, the organic light-emitting device 100 may further include an ETL between the EML 30 and the EIL 50.

The ETL may comprise a material having good electron transport capability. For example, the ETL may include any known electron transport materials. Examples of electron transport materials include tris-(8-hydroxyquinoline)aluminum (Alq3), bis(8-hydroxy-2-methylquinoline)-(4-phenylphenoxy)aluminum (Balq), 3-(4-biphenyl)-4-phenyl-5-(4-tert-butylphenyl)-1,2,4-triazole (TAZ), bis(10-hydroxybenzo[h]quinolinato)beryllium (Bebq2), and derivatives thereof. The electron transport material may further include a metal oxide. For example, the metal oxide may be an oxide of an alkali metal, an alkali earth metal, or a transition metal.

The organic light-emitting device 100 may further include at least one of a HIL and a HTL between the EML 30 and the first electrode 20. Alternatively, the organic light-emitting device 100 may further include the hole injection and transport layer 25 functioning as both a HIL and a HTL between the EML 30 and the first electrode 20.

An organic layer that contacts the first electrode 20 and forms an interface with the same may be a HIL, or may be a HTL if the organic light-emitting device does not include a HIL. In some embodiments, the organic layer may be the hole injection and transport layer 25 functioning as both a HIL and a HTL.

The HIL may include any known hole injection materials. Examples of hole injection materials include phthalocyanine compounds, such as copper phthalocyanine (CuPc) or the like; star-burst type amine derivatives, such as 4,4',4"-tris(N-carbazolyl)triphenylamine (TCTA) and 4,4',4"-tris(3-methylphenylphenylamino)triphenylamine (m-MTDATA); and soluble polymers, such as polyaniline/dodecylbenzensulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate) (PANI/PSS). However, any hole injection material may be used.

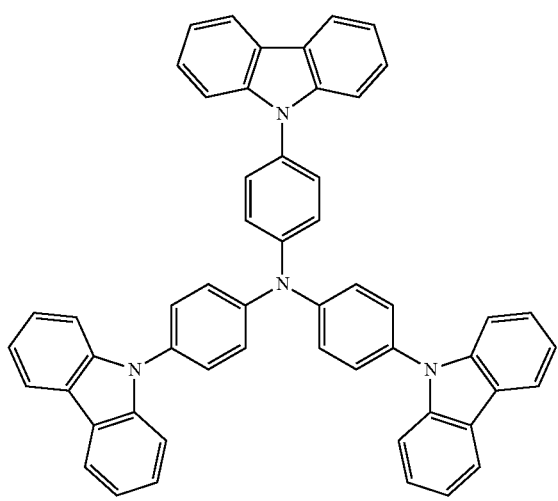

TCTA

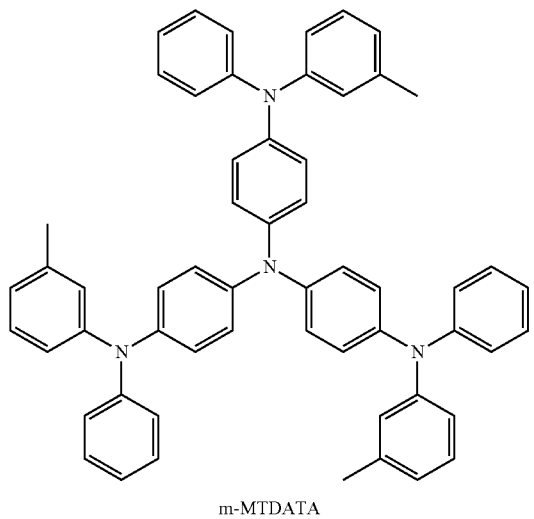

m-MTDATA

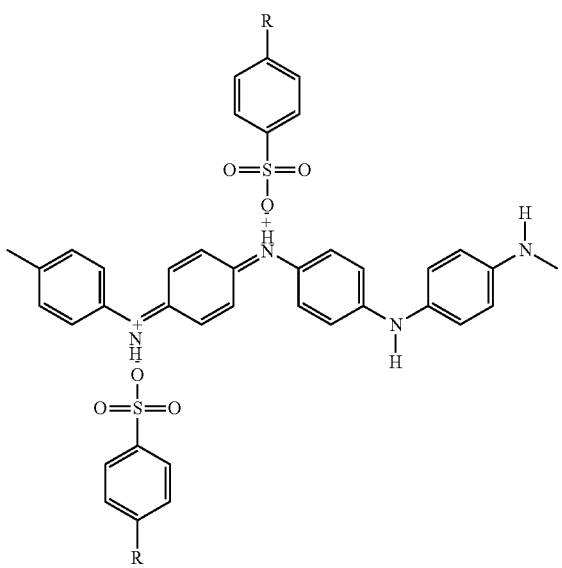

Pani/DBSA

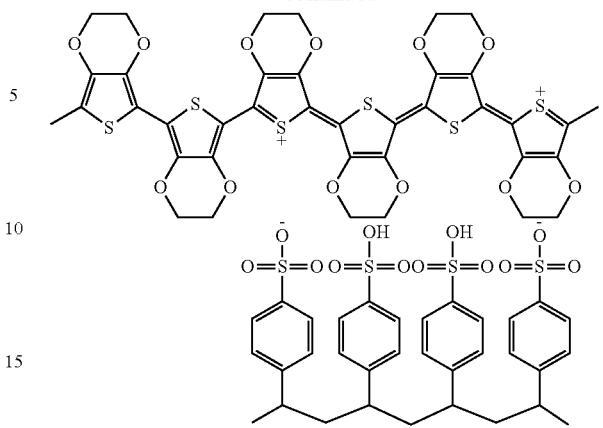

PEDOT/PSS

The HTL may include any known hole transport materials. Typical hole transport materials include carbazole derivatives, amine derivatives having aromatic condensed rings, and the like. Examples of hole transport materials include N-phenylcarbazole, polyvinyl carbazole, 1,3,5-tricarbazolylbenzene, 4,4'-biscarbazolylbiphenyl, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-diphenyl-N,N'-bis(1-naphthyl)-(1.1'-biphenyl)-4,4'-diamine (NPB), N,N'-bis(3-methylphenyl)-N,N'-diphenyl-[1,1-biphenyl]-4,4'-diamine (TPD), poly(9,9-dioctylfluorene-co-N-(4-butylphenyl) diphenylamine (TFB), or poly(9,9-dioctylfluorene-co-bis-(4-butylphenyl-bis-N,N-phenyl-1,4-phenylenediamine (PFB), and the like. However, any hole transport material may be used.

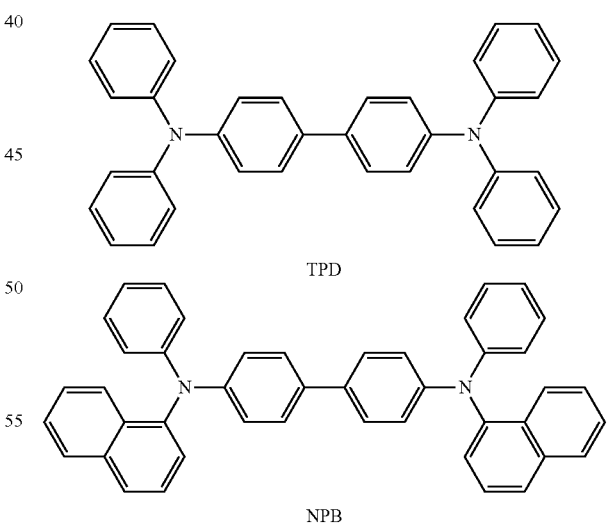

TPD

NPB

The hole injection and transport layer 25 may include any mixture of the hole injection materials and the hole transport materials listed above. However, any suitable mixture of hole injection materials and hole transport materials not listed above may be used.

The organic light-emitting device 100 may include a capping layer 70 on the second electrode 60.

The capping layer 70 may include an organic material, an inorganic material, or a mixture of these materials. The capping layer 70, which is normally disposed on the second electrode 60, may improve viewing angle characteristics and external emission efficiency. The capping layer 70 may protect the underlying second electrode 60 and organic layers from deteriorating by external moisture or oxygen.

For example, the organic material may be at least one material selected from the group consisting of triamine derivatives, arylene diamine derivatives, Alq3, and 4,4'-bis-carbazolylbiphenyl (CBP).

The inorganic material may be at least one material selected from the group consisting of ITO, IZO, $SiO_2$, SiNx, $Y_2O_3$, $WO_3$, $MoO_3$, and $Al_2O_3$.

The capping layer 70 may have any of a variety of structures, for example, a single-layer structure including a material selected from among an organic material, an inorganic material, and a mixture thereof, or a multi-layer structure including materials having different refractive indices.

The capping layer 70 may have a refractive index different from that of air. For example, the capping layer 70 may have a refractive index of from about 1.2 to about 5.0. When the refractive index of the capping layer 70 is within this range, the capping layer 70 may efficiently attenuate total reflection from the second electrode 60, and thus, may lead to higher external light efficiency. In addition, the capping layer 70 may reduce variations in color coordinates and in the intensity of emitted light according to viewing angles of a user. For example, the capping layer 70 may have a refractive index of from about 1.2 to about 3.0.

Light passing out from the capping layer 70 is reflected at an interface between the capping layer 70 and the external air towards the surface of the second electrode 60. The light incident on the surface of the second electrode 60 is reflected back out from the capping layer 70. However, the light reflected from the capping layer 70 interferes with the light reflected by the capping layer 70 into the second electrode 60 due to their different path. Thus, a smaller amount of light may be lost through the total reflection from the second electrode 60, and a larger amount of light may transmit, thus increasing the emission efficiency of the organic light-emitting device 100. Light emitted from red, green, and blue pixels have different wavelengths, and thus, regions of the capping layer 70 corresponding to the red, green, and blue sub-pixels may have different thicknesses, for example, ranging from about 1 nm to about 200 nm. When the thickness of the capping layer 70 is about 1 nm or greater, the capping layer 70 may externally emit light. When the thickness of the capping layer is about 200 nm or less, the light absorption by the capping layer 70 may be not so high that good luminescent efficiency may be attained.

Figure 2:
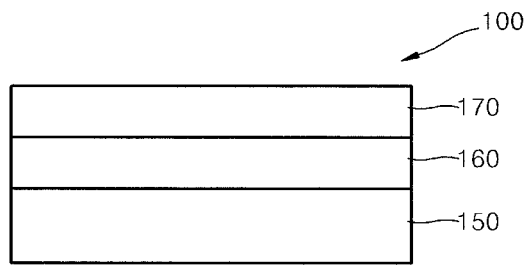
FIG. 2 is an enlarged cross-sectional view illustrating a partial structure of an organic light-emitting device according to an embodiment, which includes an electron injection layer, a second electrode, and a capping layer.

FIG. 2 is an enlarged cross-sectional view illustrating a partial structure of an organic light-emitting device according to an embodiment, the structure including an EIL 150, a second electrode 160, and a capping layer 170.

Referring to FIG. 2, the capping layer 170, which is the uppermost layer of the organic light-emitting device, may include an organic material, an inorganic material, or a mixture thereof to improve viewing angle characteristics and external emission efficiency. The capping layer 170 may include a material having a refractive index different from that of air in order to help light be emitted from the organic light-emitting device. The capping layer 70 may have a thickness of about 1 to about 200 nm to attain improved transmission characteristics and viewing angle characteristics. Although illustrated in FIG. 2 as a single layer comprising a material, the capping layer 170 may be a stack of layers of materials having different refractive indices. The capping layer 170 may be formed by thermal deposition, coating, or the like.

The second electrode 160 including Ag underlies the capping layer 170. The second electrode 160 may transmit light, and simultaneously, may reflect part of light. The second electrode 160 may have a lower light absorbance, a higher light transmittance, and a higher light reflectivity, compared with common electrodes including Mg and Ag.

Given its light transmittance and reflectivity, the second electrode 160 may have a thickness of about 1 to about 30 nm. The second electrode 160 may include at least one second metal selected from the group consisting of Al, Pt, Yb, Nd, and Mg, in an amount of about 20 parts by weight based on 100 parts by weight of Ag, to attain good thin film characteristics. The second electrode 160 may be formed by any of a variety of methods, for example, thermal deposition, sputtering, or the like.

The EIL 150 facilitating injection of electrons lies under the second electrode 160. The EIL 150 may comprise a mixture of at least one alkali metal-containing compound selected from the group consisting of LiF, LiQ, CsF, NaF, NaQ, and $Li_2O$, and at least one first metal selected from the group consisting of Yb, Tb, Ho, Sm, Eu, Pr, Ce, Al, and Mg. The weight ratio of the alkali metal-containing compound to the first metal may be from about 10:90 to about 90:10. The EIL 150 may have a thickness of about 0.1 to about 30 nm. The EIL 150 may be formed by any of a variety of methods, for example, by co-depositing the alkali metal-containing compound and the first metal, or by depositing a mixture of the alkali metal-containing compound and the first metal via thermal deposition, vacuum deposition, chemical vapor deposition (CVD), sputtering, spin-coating, or spin-casting.

Figure 3:
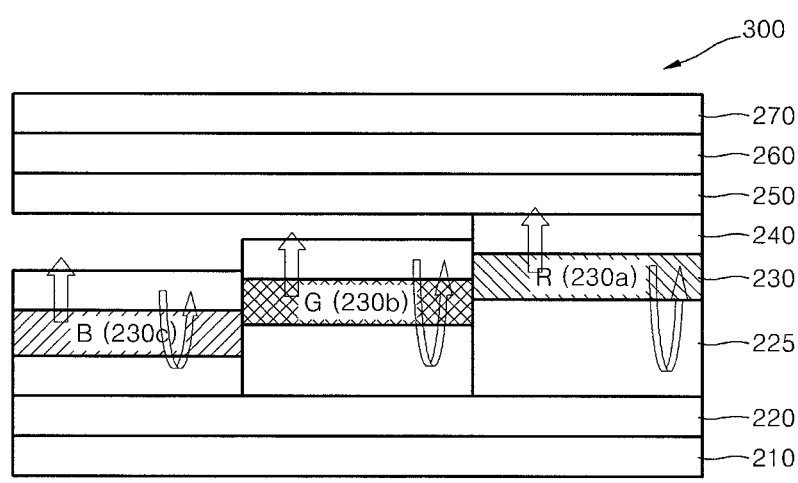
FIG. 3 is a cross-sectional view illustrating a structure of an organic light-emitting device according to an embodiment.

FIG. 3 is a cross-sectional view illustrating a structure of an organic light-emitting device 300 according to an embodiment.

Referring to FIG. 3, the organic light-emitting device 300 includes a substrate 210, a first electrode 220 on the substrate 210, a second electrode 260 including Ag, and an emission layer 230, including R, G, and B sub-pixels 230a, 230b and 230c, between the first electrode 220 and the second electrode 260. An EIL 250 including a mixture of an alkali metal-containing compound and a first metal is between the emission layer 230 and the second electrode 260. An ETL 240 is disposed between the EIL 250 and the emission layer 230. A hole injection and transport layer 225 is disposed between the emission layer 230 and the first electrode 220. A capping layer 270 is disposed on the second electrode 260.

The substrate 210 may include a thin film transistor, an electric circuit, and wiring for driving the organic light-emitting device 300. Incoming external signals are changed into specific current levels while passing from the substrate 210 to the first electrode 220 and reach the first electrode 220.

For a top-emission organic light-emitting device, the first electrode 220 may comprise a metal reflection layer. The first electrode 220 may apply an electric field to the organic light-emitting device 300 along with the second electrode 260. In the present embodiment, the first electrode 20 may function as an anode. The first electrode 220 has good reflection characteristics. Thus, the first electrode 220 may reflect incident light toward a front side of the organic light-emitting device 300, and may provide a microcavity effect along with the second electrode 260 having a high reflectivity.

The hole injection and transport layer 225, which is disposed on the first electrode 220, injects and transports charges.

The emission layer 230, which lies on the hole injection and transport layer 225, includes R, G and B sub-pixels.

The ETL 240, which is disposed on the emission layer 230, transports electrons.

The EIL 250, which is disposed on the ETL 240, includes a mixture of an alkali metal-containing compound and a first metal, as described above.

The second electrode 260, which is disposed on the EIL 250, includes Ag. In the present embodiment, the second electrode 160 may function as a cathode.

The capping layer 270, which is disposed on the second electrode 160, includes an organic material, an inorganic material, or a mixture thereof.

Although the current embodiment describes a top-emission organic light-emitting device, the present embodiments are not limited thereto and may be applied to organic light-emitting devices having any structures, as long as they include a substrate, a first electrode disposed on the substrate, a second electrode disposed on the substrate and including silver (Ag), an emission layer between the first and second electrodes, an EIL between the emission layer and the second electrode, the EIL including a mixture of an alkali metal-containing compound and a first metal, and a capping layer. For example, for a bottom-emission organic light-emitting device, an EIL including a mixture of an alkali metal-containing compound and a first metal, and a second electrode including Ag may be thicker than those of the top-emission organic light-emitting device described above, and a capping layer may underlie a first electrode.

The organic light-emitting device according to embodiments may be a top-emission organic light-emitting device including a capping layer comprising a transparent material and in which light emitted from the emission layer travels out of the organic light-emitting device through the capping layer. For example, the organic light-emitting device may have a structure including: a substrate; a reflective first electrode on the substrate and including at least one metal selected from the group consisting of Ag, Mg, Al, Pt, Pd, Au, Ni, Nd, Ir, Cr, Li, and Ca, and at least one conductive material selected from the group consisting of ITO, IZO, ZnO, $SnO_2$, and $In_2O_3$; a transparent second electrode on the substrate and including Ag; an emission layer between the first electrode and the second electrode; an EIL between the emission layer and the second electrode and including a mixture of an alkali metal-containing compound and a first metal; a hole injection and transport layer between the emission layer and the first electrode; and a capping layer on the second electrode. In the top-emission organic light-emitting device, the first electrode may have a thickness of about 10 to about 300 nm. The second electrode may have a thickness of about 1 to about 30 nm. Light emitted from the emission layer may travel out of the device through the capping layer.

For example, the organic light-emitting device may have a structure including a substrate; a first electrode; a hole injection and transport layer (not necessary); an emission layer; an EIL including a mixture of LiQ and Yb in a 1:1 weight ratio; a second electrode including Ag; and a capping layer including a triamine derivative. Alternatively, the organic light-emitting device may have a structure including a substrate; a hole injection and transport layer (optional); an emission layer; an EIL including a mixture of LiQ and Yb in a 1:1 weight ratio; a second electrode including a mixture of Ag and Yb in a 85:15 weight ratio; and a capping layer including a triamine derivative. Alternatively, the organic light-emitting device may have a structure including a substrate; a first electrode; a hole injection and transport layer (optional); an emission layer; an EIL including a mixture of LiF and Yb in a 1:1 weight ratio; a second electrode including Ag; and a capping layer including a triamine derivative. Alternatively, the organic light-emitting device may have a structure including a substrate; a first electrode; a HIL (optional), an emission layer; an EIL including a mixture of LiF and Yb in a 1:1 weight ratio; a second electrode including a mixture of Ag and Yb in a 85:15 weight ratio; and a capping layer including a triamine derivative.

The organic light-emitting device according to embodiments may be a bottom-emission organic light-emitting device including a substrate comprising a transparent material and in which light emitted from the emission layer travels out of the organic light-emitting device through the substrate. For example, the organic light-emitting device may have a structure including: a transparent substrate; a transparent first electrode on the transparent substrate and including at least one conductive material selected from the group consisting of ITO, IZO, ZnO, $SnO_2$, and $In_2O_3$; a reflective second electrode on the transparent substrate and including Ag; an EML between the first electrode and the second electrode; an EIL between the emission layer and the second electrode and including a mixture of an alkali metal-containing compound and a first metal; a hole injection and transport layer between the emission layer and the first electrode; and a capping layer on a surface of the second electrode opposite to the emission layer. In the bottom-emission organic light-emitting device, the second electrode may have a thickness of about 1 to about 200 nm.

Hereinafter, an embodiment of a method of manufacturing an organic light-emitting device will be described. The organic light-emitting device may include a substrate, a first electrode, a HIL, a HTL, an EML, an ETL, and EIL, a second electrode, and a capping layer that are sequentially disposed on one another. The HIL and the HTL may be replaced by a hole injection and transport layer. The ETL may not be formed.

Initially, the first electrode is formed on the substrate. The substrate may be any substrate that is used in conventional organic light emitting devices. In this regard, the substrate may be selected from among a glass substrate and a plastic substrate, in consideration of transparency, surface smoothness, ease of handling, and water resistance. The first electrode may be implemented in various forms, for example, as a transparent electrode or a reflective electrode.

Then, the HIL may be formed on the first electrode by thermal deposition, vacuum deposition, chemical vapor deposition (CVD), sputtering, spin coating, spin casting, or the like.

When the HIL is formed using vacuum deposition, the deposition conditions may vary according to the material that is used to form the HIL, and the structure and thermal characteristics of the HIL to be formed. For example, the deposition conditions may include a deposition temperature of from about 100 to about 500° C., a vacuum pressure of from about $10^{-8}$ to about $10^{-3}$ torr, and a deposition rate of from about 0.01 to about 100 Å/sec.

When the HIL is formed using spin coating, coating conditions may vary according to the material that is used to form the HIL, and the desired structure and thermal characteristics of the HIL to be formed. For example, the coating speed may be from about 2000 rpm to about 5000 rpm, and a temperature for heat treatment, which is performed to remove a solvent after coating, may be from about 80° C. to about 200° C.

The HIL may comprise any known hole injection material. The HIL may have a thickness of about 20 to about 200 nm. When the thickness of the HIL is about 20 nm or greater, the HIL may have good hole injection characteristics. When the thickness of the HIL is about 200 nm or less, an appropriate driving voltage may be attained.

Then, the HTL may be formed on the HIL using thermal deposition, vacuum deposition, CVD, sputtering, spin coating, spin casting, or the like. When the HTL is formed using vacuum deposition or spin coating, the conditions for deposition and coating are similar to those for the formation of the HIL, though the conditions for the deposition and coating may vary according to the material that is used to form the HTL.

The HTL may comprise any known hole transport material. The HTL may have a thickness of about 10 to about 100 nm. When the thickness of the HTL is about 10 nm or greater, the HTL may have good hole transport characteristics. When the thickness of the HTL is about 100 nm or less, an appropriate driving voltage may be attained.

Instead of the HIL and the HTL, a hole injection and transport layer may be formed using a mixture of a hole injection material and a hole transport material. The conditions for forming the hole injection and transport layer may be similar to those used to form the HIL, although the formation method and the thickness of the hole injection and transport layer may vary according to the material that is used to form the hole injection and transport layer.

Then, the EML may be formed on the HTL by using thermal deposition, vacuum deposition, CVD, sputtering, spin coating, spin casting, or the like. When the EML is formed using vacuum deposition or spin coating, the conditions for deposition and coating are similar to those for the formation of the HIL, although conditions for the deposition and coating may vary according to the material that is used to form the EML.

The EML may be formed using any known light-emitting material, such as known hosts and dopants. Dopants that may be used to form the EML may include either a fluorescent dopant or a phosphorescent dopant, which are widely known in the art.

The amount of the dopant may be from about 0.1 to about 20 parts by weight based on 100 parts by weight of the EML material, which is equivalent to the total weight of the host and the dopant. When the amount of the dopant is 0.1 parts by weight or greater, the addition of the dopant may be effective. When the amount of the dopant is 20 parts by weight or less, concentration quenching may not occur regardless of the use of either a phosphorescent dopant or a fluorescent dopant. The EML may have a thickness of about 10 to about 100 nm. When the thickness of the EML is 10 nm or greater, light emission characteristics may appear in the EML. When the thickness of the EML is 100 nm or less, there may be no rise in driving voltage.

When the EML includes a phosphorescent dopant, a HBL may be formed on the EML in order to prevent diffusion of triplet excitons or holes into the ETL. In this case, the HBL may comprise any material commonly used to form a HBL. Examples of HBL materials include oxadiazole derivatives, triazole derivatives, phenathroline derivatives, Balq, and BCP, which are known in the art.

Then, the ETL may be formed on the EML by using thermal deposition, vacuum deposition, CVD, sputtering, spin coating, spin casting, or the like. When the ETL is formed using vacuum deposition or spin coating, the conditions for deposition and coating are similar to those for the formation of the HIL, though the conditions for the deposition and coating may vary according to the material that is used to form the HTL.

The ETL may have a thickness of about 10 to about 40 nm. When the thickness of the ETL is 10 nm or greater, the ETL may have an appropriate electron transport rate leading to a charge equilibrium. When the thickness of the ETL is 40 nm or less, there may be no rise in driving voltage.

Then, the EIL may be formed on the ETL by using thermal deposition, vacuum deposition, CVD, sputtering, spin coating, spin casting, or the like. When the EIL is formed using vacuum deposition or spin coating, the conditions for deposition and coating are similar to those for the formation of the HIL, though the conditions for the deposition and coating may vary according to the material that is used to form the EIL.

The material for forming the EIL may include a mixture of an alkali metal-containing compound and a first metal described above. The alkali metal-containing compound may include at least one material selected from the group consisting of LiF, LiQ, CsF, NaF, NaQ, and $Li_2O$. The first metal may include at least one material selected from the group consisting of Yb, Tb, Ho, Sm, Eu, Pr, Ce, Al, and Mg. For example, the material for forming the EIL may be a mixture of LiQ and Yb in a 1:1 weight ratio.

The EIL may have a thickness of about 0.1 to about 30 nm. When the thickness of the EIL is about 0.1 nm or greater, effective electron injection may be ensured. When the thickness of the EIL is about 30 nm or less, there may be no rise in driving voltage.

Then, the second electrode may be formed by depositing a second-electrode material including Ag on the EIL, thereby completing the manufacture of the organic light-emitting device.

The second-electrode material may further include a second metal having good conductivity. For example, the second-electrode material may further include at least one second metal selected from the group consisting of Al, Pt, Yb, Nd and Mg, in an amount of about 20 parts by weight based on 100 parts by weight of Ag. In a top-emission organic light-emitting device, the second electrode may have a thickness of about 1 to about 30 nm.

The first electrode and the second electrode may function as an anode and a cathode, respectively. However, the reverse is also possible.

Embodiments of the organic light-emitting device according to the present embodiments and methods of manufacturing the same are described above. However, the present embodiments are not limited to the structures illustrated in FIGS. 1 through 3, and the organic light-emitting device according to embodiments may have other structures.

The organic light-emitting device according to embodiments may be included in various types of flat panel display devices, such as in a passive matrix organic light-emitting display device or in an active matrix organic light-emitting display device. In particular, when the organic light-emitting device is included in an active matrix organic light-emitting display device including a thin-film transistor, the first electrode may be electrically connected to a source electrode or a drain electrode of a thin-film transistor in the organic light-emitting device.

Hereinafter, one or more embodiments will be described in detail with reference to the following examples. These examples are not intended to limit the purpose and scope of the one or more embodiments.

EXAMPLE 1

A first electrode having an area of 2 mm×2 mm was formed using Ag on a substrate. Then, an ITO layer was deposited on the first electrode to a thickness of 70 Å. The resulting structure was ultrasonically cleaned and pre-treated (using UV-$O_3$ or heat).

Then, IDE406 (Idemitsu Co. (Tokyo, Japan)) was vacuum-deposited on the pre-treated first electrode to a thickness of 650 Å to form a HIL. Before defining R, G, and B emission layers on the HIL, auxiliary layers were formed by vacuum-depositing HTM021 (Merck Co.) to thicknesses of 600 Å and 700 Å on G and B emission regions of the HIL, respectively. IDE320 (Idemitsu Co.) was vacuum-deposited on the HIL and the auxiliary layers to a thickness of 650 Å to form a HTL.

BH215 (Idemitsu Co.) doped with 5 wt % of BD052 (Idemitsu Co.) was vacuum-deposited on a B emission region of the HTL to a thickness of 200 Å to form the B emission layer. TMM004 (Merck Co.) doped with 7 wt % of Ir(PPy)3 was vacuum-deposited on a G emission region of the HTL to a thickness of 200 Å to form the G emission layer. TMM004 (Merck Co.) doped with 15 wt % of TER021 (Merck Co.) was vacuum-deposited on a R emission region of the HTL to a thickness of 400 Å to form the R emission layer. Alq3 was vacuum deposited on the EML to form an ETL having a thickness of 300 Å.

Ytterbium (Yb) and lithium fluoride (LiF) were deposited on the ETL in a weight ratio of 1:1 to a thickness of 20 Å to form an EIL. Then, Ag was vacuum-deposited to a thickness of 200 Å to form a second electrode.

IDE406 (refractive index (n)=1.8) was deposited on the second electrode to a thickness of 600 Å to form a capping layer.

EXAMPLE 2

An organic light-emitting device was manufactured in the same manner as in Example 1, except that Yb and lithium quinolate (LiQ) were deposited on the ETL in a weight ratio of 1:1 to a thickness of 20 Å to form the EIL, and a metal mixture of Ag and Yb in a 85:15 weight ratio was vacuum-deposited on the EIL to a thickness of 200 Å to form the second electrode.

EXAMPLE 3

An organic light-emitting device was manufactured in the same manner as in Example 1, except that a metal mixture of Ag and Yb in a weight ratio of 85:15 was vacuum-deposited on the EIL to a thickness of 200 Å to form the second electrode, and IDE406 (refractive index (n)=1.8) was deposited on the second electrode to a thickness of 600 Å to form the capping layer.

COMPARATIVE EXAMPLE 1

An organic light-emitting device was manufactured in the same manner as in Example 1, except that lithium quinolate (LiQ) was deposited on the ETL to a thickness of 10 Å to form the EIL, and a metal mixture of Mg and Ag in a weight ratio of 10:1 was vacuum-deposited on the EIL to form the second electrode.

COMPARATIVE EXAMPLE 2

An organic light-emitting device was manufactured in the same manner as in Example 1, except that lithium quinolate (LiQ) was deposited on the ETL to a thickness of 10 Å to form the EIL.

COMPARATIVE EXAMPLE 3

An organic light-emitting device was manufactured in the same manner as in Example 1, except that a metal mixture of Mg and Ag in a weight ratio of 10:1 was vacuum-deposited on the EIL to a thickness of 120 Å to form the second electrode.

A driving voltage at a current density of 50 mA/$cm^2$, luminance, luminescent efficiency, and color coordinates of each of the organic light-emitting devices manufactured in Examples 1-3 and Comparative Examples 1-3 were measured. The results are shown in Table 1 below.

TABLE 1

| | Driving voltage (V) | Current density (mA/$cm^2$) | Luminance (cd/$m^2$) | Luminescent efficiency (cd/A) | Color coordinates |
|---|---|---|---|---|---|
| Example 1 | 4 | 12.5 | 425 | 3.4 | 0.05 |
| Example 2 | 4 | 12.7 | 445 | 3.5 | 0.05 |
| Example 3 | 4 | 13 | 442 | 3.4 | 0.05 |
| Comparative Example 1 | 4 | 8.6 | 233 | 2.7 | 0.05 |
| Comparative Example 2 | 4 | 7.2 | 188 | 2.6 | 0.05 |
| Comparative Example 3 | 4 | 7.7 | 208 | 2.7 | 0.05 |

Figure 4:
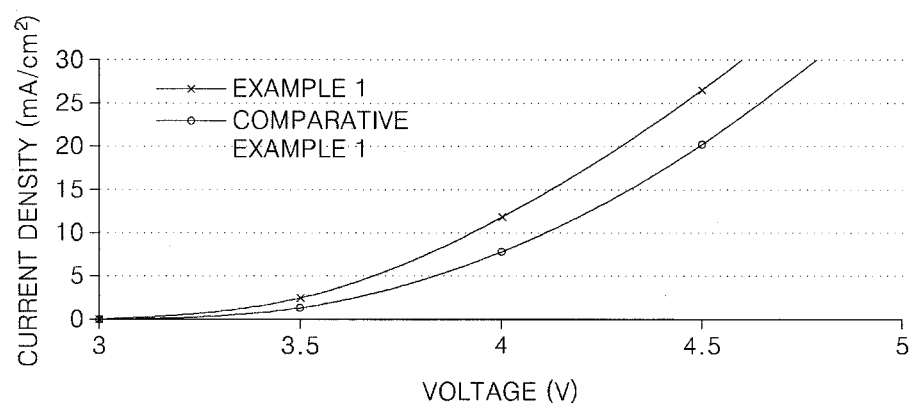
FIG. 4 is a graph of current density versus voltage of organic light-emitting devices manufactured in Example 1 and Comparative Example 1 in a blue wavelength range.
Figure 5:
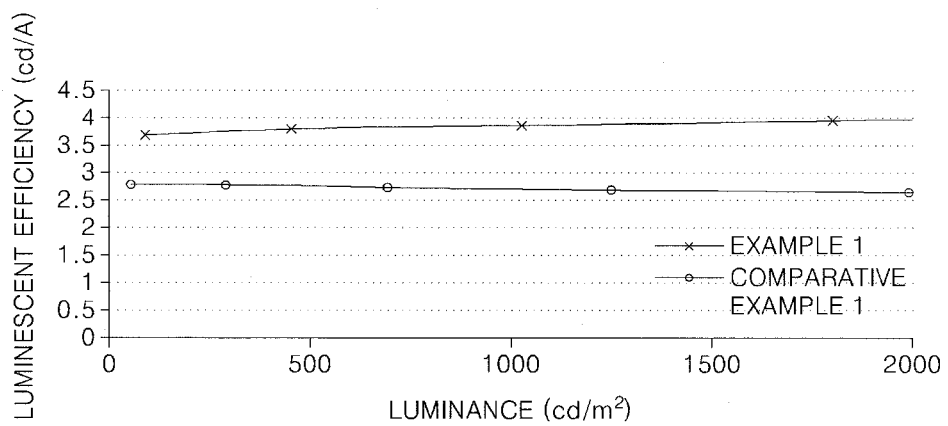
FIG. 5 is a graph of luminescent efficiency versus luminance of the organic light-emitting devices manufactured in Example 1 and Comparative Example 1 in a blue wavelength range.

FIGS. 4 and 5 are graphs illustrating electro-optical characteristics of the organic light-emitting devices of Example 1 and Comparative Example 1 in a blue wavelength range of 420-480 nm. Referring to FIG. 4, the organic light-emitting devices of Example 1 and Comparative Example 1 exhibit similar driving characteristics in regards to electron injection and voltage. FIG. 5 is a graph of luminescent efficiencies of the organic light-emitting devices of Example 1 and Comparative Example 1. Referring to FIG. 5, the luminescent efficiency of the organic light-emitting device of Example 1 is about 20% or greater than that of the organic light-emitting device of Comparative Example 1. Referring to Table 1, the organic light-emitting devices of Examples 1-3 have similar driving voltages but exhibit higher luminescent efficiencies than those of Comparative Examples 1-3.

Figure 6:
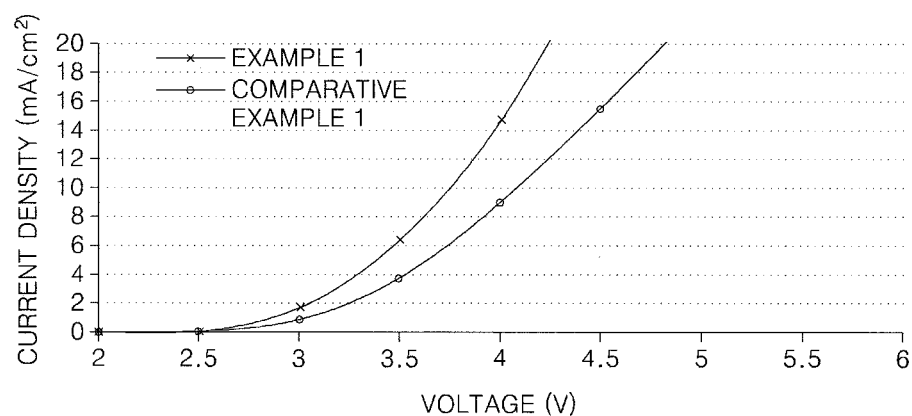
FIG. 6 is a graph of current density versus voltage of the organic light-emitting devices manufactured in Example 1 and Comparative Example 1 in a green wavelength range.
Figure 7:
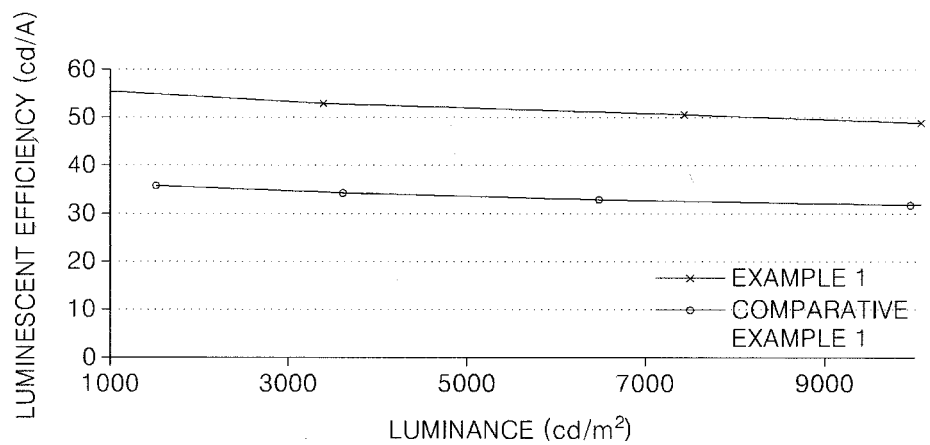
FIG. 7 is a graph of luminescent efficiency versus luminance of the organic light-emitting devices manufactured in Example 1 and Comparative Example 1 in a green wavelength range.

FIGS. 6 and 7 are graphs illustrating electro-optical characteristics of the organic light-emitting devices of Example 1 and Comparative Example 1 in a green wavelength range of 500-560 nm. FIG. 6 is a graph of current density versus voltage of the organic light-emitting devices of Example 1 and Comparative Example 1 in the green wavelength range. Referring to FIG. 6, the organic light-emitting device of Example 1 exhibits a higher current density at the same voltage level, compared to the organic light-emitting device of Comparative Example 1. Referring to FIG. 7, the organic light-emitting device of Comparative Example 1 exhibits a higher luminescent efficiency of about 50 cd/A or greater, compared to the organic light-emitting device of Comparative Example 1 having a luminescent efficiency of about 30 cd/A. In conclusion, the luminescent efficiency and driving voltage characteristics of the organic light-emitting device of Example 1 are better in both blue and green wavelength ranges than those of the organic light-emitting device of Comparative Example 1.

The organic light-emitting device according to embodiments includes a second electrode that is electrically stable, and thus, has improved electron injection characteristics and light transmittance. Thus, the organic light-emitting device has improved driving voltage and efficiency characteristics.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting device comprising:
   a substrate;
   a first electrode disposed on the substrate;
   a second electrode disposed on the substrate and comprising more silver (Ag) than any other material;
   an emission layer between the first electrode and the second electrode;
   an electron injection layer between the emission layer and the second electrode and comprising a mixture of an alkali metal-containing compound and a first metal; and
   a capping layer disposed on the second electrode.

2. The organic light-emitting device of claim 1, wherein the alkali metal-containing compound comprises at least one material selected from the group consisting of LiF, LiQ, CsF, NaF, NaQ, and $Li_2O$.

3. The organic light-emitting device of claim 1, wherein the first metal comprises at least one metal selected from the group consisting of ytterbium (Yb), terbium (Tb), holmium (Ho), samarium (Sm), europium (Eu), praseodymium (Pr), cerium (Ce), aluminum (Al), and magnesium (Mg).

4. The organic light-emitting device of claim 1, wherein a weight ratio of the alkali metal-containing compound and the first metal is from about 1:9 to about 9:1.

5. The organic light-emitting device of claim 1, wherein the alkali metal-containing compound comprises LiQ, the first metal comprises Yb, and the weight ratio of LiQ to Yb is about 1:1.

6. The organic light-emitting device of claim 1, wherein the electron injection layer has a thickness of about 0.1 to about 30 nm.

7. The organic light-emitting device of claim 1, wherein the second electrode further comprises at least one second metal selected from the group consisting of aluminum (Al), platinum (Pt), ytterbium (Yb), neodymium (Nd), and magnesium (Mg), and the amount of the second metal is from about 0.01 to about 20 parts by weight based on 100 parts by weight of Ag.

8. The organic light-emitting device of claim 1, wherein the second electrode has a thickness of about 1 nm to about 30 nm.

9. The organic light-emitting device of claim 1, wherein the capping layer comprises an organic material, an inorganic material, or a mixture thereof.

10. The organic light-emitting device of claim 1, wherein the capping layer has a refractive index of about 1.2 to about 5.0.

11. The organic light-emitting device of claim 1, wherein the capping layer comprises an inorganic material, and the inorganic material comprises at least one selected from the group consisting of ITO, IZO, $SiO_2$, SiNx, $Y_2O_3$, $WO_3$, $MoO_3$, and $Al_2O_3$.

12. The organic light-emitting device of claim 1, wherein the capping layer comprises an organic material, and the organic material comprises at least one selected from the group consisting of triamine derivatives, arylene diamine derivatives, tris(8-quinolinorato)aluminum (Alq3), and 4,4'-biscarbazolylbiphenyl (CBP).

13. The organic light-emitting device of claim 1, wherein the capping layer has a thickness of about 1 nm to about 200 nm.

14. The organic light-emitting device of claim 1, further comprising a hole injection layer, a hole transport layer, or a hole injection and transport layer between the first electrode and the emission layer.

15. The organic light-emitting device of claim 1, wherein the electron injection layer comprises a mixture of LiQ and Yb in a weight ratio of about 1:1, the second electrode comprises silver (Ag), and the capping layer comprises a triamine derivative.

16. The organic light-emitting device of claim 1, wherein the electron injection layer comprises a mixture of LiQ and Yb in a weight ratio of about 1:1, the second electrode comprises a mixture of Ag and Yb in a weight ratio of about 17:3, and the capping layer comprises a triamine derivative.

17. The organic light-emitting device of claim 1, wherein the electron injection layer comprises a mixture of LiF and Yb in a weight ratio of about 1:1, the second electrode comprises silver (Ag), and the capping layer comprises a triamine derivative.

18. The organic light-emitting device of claim 1, wherein the electron injection layer comprises a mixture of LiF and Yb in a weight ratio of about 1:1, the second electrode comprises a mixture of Ag and Yb in a weight ratio of about 17:3, and the capping layer comprises a triamine derivative.

19. A bottom-emission organic light-emitting device comprising:
   a substrate;
   a first electrode disposed on the substrate;
   a second electrode disposed on the substrate and comprising more silver (Ag) than any other material;
   an emission layer between the first electrode and the second electrode;
   an electron injection layer between the emission layer and the second electrode and comprising a mixture of an alkali metal-containing compound and a first metal; and
   a capping layer disposed on a surface of the second electrode opposite to the emission layer.

20. The bottom-emission organic light-emitting device of claim 19, wherein the second electrode has a thickness of about 1 nm to about 200 nm.

* * * * *

UNITED STATES PATENT AND TRADEMARK OFFICE
CERTIFICATE OF CORRECTION

PATENT NO.       : 8,415,874 B2                                            Page 1 of 1
APPLICATION NO.  : 13/043371
DATED            : April 9, 2013
INVENTOR(S)      : Song et al.

It is certified that error appears in the above-identified patent and that said Letters Patent is hereby corrected as shown below:

On the Title page (item 75, Inventors) at line 9, Change "Won-Jung" to --Won-Jong--.

Signed and Sealed this
Twenty-eighth Day of January, 2014

Michelle K. Lee
*Deputy Director of the United States Patent and Trademark Office*